US007557600B2

(12) United States Patent
Chong et al.

(10) Patent No.: US 7,557,600 B2
(45) Date of Patent: Jul. 7, 2009

(54) PROGRAMMABLE JOSEPHSON VOLTAGE STANDARD DEVICE EMPLOYING MICROWAVE DRIVING OF MULTIPLE FREQUENCIES

(75) Inventors: Yon Uk Chong, Seoul (KR); Kyu Tae Kim, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 11/604,230

(22) Filed: Nov. 27, 2006

(65) Prior Publication Data

US 2007/0132481 A1   Jun. 14, 2007

(30) Foreign Application Priority Data

Nov. 28, 2005   (KR) .................... 10-2005-0114264

(51) Int. Cl.
*H03K 19/195*   (2006.01)
(52) U.S. Cl. ........................................................ 326/1
(58) Field of Classification Search .................. 326/1–3
See application file for complete search history.

(56) References Cited

U.S. PATENT DOCUMENTS

| 5,126,598 | A | * | 6/1992 | Kotani ............................ 326/3 |
| 6,882,293 | B2 | * | 4/2005 | Shoji et al. ................... 341/133 |
| 2004/0099861 | A1 | * | 5/2004 | Shoji et al. ..................... 257/31 |

* cited by examiner

*Primary Examiner*—Rexford N Barnie
*Assistant Examiner*—Thienvu V Tran
(74) *Attorney, Agent, or Firm*—Duane Morris LLP

(57) ABSTRACT

The present invention relates to a finely programmable Josephson voltage standard device employing microwave driving of multiple frequencies. To this end, the programmable Josephson voltage standard device includes a first element group 10a having the plurality of Josephson junctions 2 connected in series and applied with a first frequency $f_1$; a second element group 20a having a plurality of Josephson junctions 2 connected in series and applied with a second frequency $f_2$ different from the first frequency $f_1$; and current bias meant for selectively applying positive (+) current or negative (−) current to the Josephson junctions 2 of the element groups 10a, 20a or stopping the supply of the current, in response to an input command. The first element group 10a and the second element group 20a are connected in series.

3 Claims, 5 Drawing Sheets

PROGRAMMABLE JOSEPHSON VOLTAGE STANDARD DEVICE EMPLOYING MICROWAVE DRIVING OF MULTIPLE FREQUENCIES

BACKGROUND OF THE INVENTION

1. Field of the Invention

The present invention relates generally to a programmable Josephson voltage standard device, and more particularly, to a programmable Josephson voltage standard device employing microwave driving of multiple frequencies.

2. Background of the Related Art

In general, a Josephson junction 2 has a structure in which an insulator or a non-superconducting metal material is intervened between two superconductors. If microwaves are radiated to the Josephson junction 2, a flat voltage step appears in current-voltage characteristic, as illustrated in FIG. 1. FIG. 1 is a representative graph showing the relationship of current and voltage output when microwaves are applied to the Josephson junction array.

The voltage step illustrated in FIG. 1 is called a "Shapiro step". In this case, the step voltage is decided by the frequency and the Josephson relation as expressed in Equation 1.

$$v = \frac{nf}{K_j},\qquad \text{[Equation 1]}$$

where n=an integer, f=microwave frequency, and $K_j$ is 483597.9 GHz/V. Precise voltage can be obtained on both positive (+) and negative (-) sides in a quantum mechanical way depending on the direction of applied current. If there is no current, the voltage becomes accurately 0 V since the junction is in superconducting state. In a superconductor-metal-superconductor junction, a desired voltage can be obtained by changing the junction state to each voltage state by using the above method. Accordingly, it is used as a programmable voltage standard.

FIG. 2 is a circuit diagram of a conventional programmable Josephson voltage standard device. FIG. 3 is a circuit diagram showing an improved version of the programmable Josephson voltage standard device illustrated in FIG. 2.

Referring to FIG. 2, in a programmable Josephson voltage standard device employing a superconductor-metal-superconductor (SNS) Josephson junction (i.e., a non-hysteretic Josephson junction), a desired voltage is obtained by turning on/off current biases of each part of an array, where Josephson junctions are connected in series and microwaves are irradiated.

In this case, each of the Josephson junctions has voltage proportional to the driving frequency based on the Josephson relation as expressed in Equation 1. Furthermore, in the frequently used microwave frequency range of 15 to 20 GHz, a voltage of several tens of μV per junction is generated. Thus, in order to obtain voltage of 1.018 V and 10 V, which is used as the standard in the industry, an element having thousands of junctions connected in series needs to be fabricated.

At this time, if microwaves are applied to all the junctions at once, junctions far from the microwave input does not exhibit a good current-voltage characteristic due to microwave attenuation along the waveguide. Thus, in practical devices, in order to obtain a final output voltage, the devices are driven with microwaves being divided into several paths and junction arrays being divided into several regions, as illustrated in FIG. 3, and the respective arrays are again connected in series. The whole array is divided into a given number of junctions so that each part can be biased with current independently. A method of dividing regions includes a binary method of $2^n$ dividing, and a trinary method of $3^n$ dividing.

Part of the array with the applied current bias becomes the voltage step state on the current-voltage characteristic curve illustrated in FIG. 1. Only the current-biased regions have voltages corresponding to the voltage step value with the positive (+) or negative (-) polarity, depending on the polarity of applied current. Regions to which current is not applied become the superconducting states (i.e., 0 V state).

Consequently, the whole output voltage $V_{output}$ will become (positive (+) biased junction number—negative (-) biased junction number)×(voltage at the voltage step). At this time, since the whole element groups are driven by microwaves of a single frequency, the entire junctions have the same voltage step. This voltage becomes a basic unit of the output voltage which can be controlled by turn-on/off of bias current.

In the case where voltage smaller than that of the basic unit is to be changed, voltage can be continuously changed by finely changing the frequency of driven microwaves according to the Josephson relation. However, in this case, it is on the assumption that an element must have a very flat frequency characteristic. On the other hand, Change of frequency is slow compared to on/off of current, depending on the characteristics of a microwave generator, and the intermediate state is very unclear. It makes rapid and fine voltage change challenging.

The voltage standard circuit employing the superconducting Josephson device is a device capable of producing precision voltage in a quantum mechanical way, based on the Josephson relation, by irradiating microwave of accurate frequency to a device including Josephson junctions.

The conventional Josephson voltage standard device in which the Josephson junctions of superconductor-insulator-superconductor (SIS) type are connected in series has been used in voltage calibration of the metrology institutions of each country. The SIS junction-based voltage standard device is suitable for generating a fixed micro voltage, but is slow in speed and requires a complicated process when voltage is changed.

Furthermore, the output voltage $V_{output}$ is proportional to the number of junctions to which a current bias is applied. Thus it can be considered to serve as a digital-analog converter (DAC) having quantum accuracy.

If change of voltage smaller than that of each junction is to be required, it can be implemented by finely changing the frequency of applied microwaves. In this case, however, there are disadvantages in that devices must have a very flat frequency characteristic and to change the frequency is slow compared to turn-on/off of the current due to the characteristic of the microwave generator. Accordingly, there are disadvantages in frequency change method that the method is relatively slow and inconvenient compared to the method of changing current bias.

SUMMARY OF THE INVENTION

Accordingly, the present invention has been made in order to solve the above problems occurring in the prior art, and it is an object of the present invention to provide a Josephson voltage standard system, in which rapid and fine voltage change can be obtained only through the control of applied current without changing microwave frequency, by applying multiple microwaves of two or more different frequencies to multiple Josephson voltage standard devices or to a collection of several groups on the same device.

To achieve the above goal, a programmable Josephson voltage standard device according to the first embodiment of the present invention includes a first element group having the plurality of Josephson junctions connected in series and applied with a first frequency; a second element group having a plurality of Josephson junctions connected in series and applied with a second frequency different from the first frequency; and current bias is meant for selectively applying positive (+) current or negative (−) current to the Josephson junctions of the element groups or stopping the supply of the current, in response to an input command. The first element group and the second element group are connected in series.

A programmable Josephson voltage standard device according to the first embodiment of the present invention includes a first element group collection in which a plurality of first element groups are connected in parallel, wherein each of the plurality of first element groups includes a plurality of Josephson junctions connected in series and is applied with a first frequency; a second element group collection in which a plurality of second element groups are connected in parallel, wherein each of the plurality of second element groups includes the plurality of Josephson junctions connected in series and is applied with a second frequency different from the first frequency; and current bias is meant for selectively applying positive (+) current or negative (−) current to the Josephson junctions of the element groups or stopping the supply of the current, in response to an input command. The first element group and the second element group 20a are connected in series.

Furthermore, the current bias means applying the current in each section of the Josephson junction array.

Furthermore, each of the element groups includes 500 to 150,000 Josephson junctions connected in series.

Furthermore, the first and second frequencies are set in the range of 15 to 20 GHz.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

The present invention will now be described in detail in connection with specific embodiments with reference to the accompanying drawings.

First Embodiment

Figure 1:
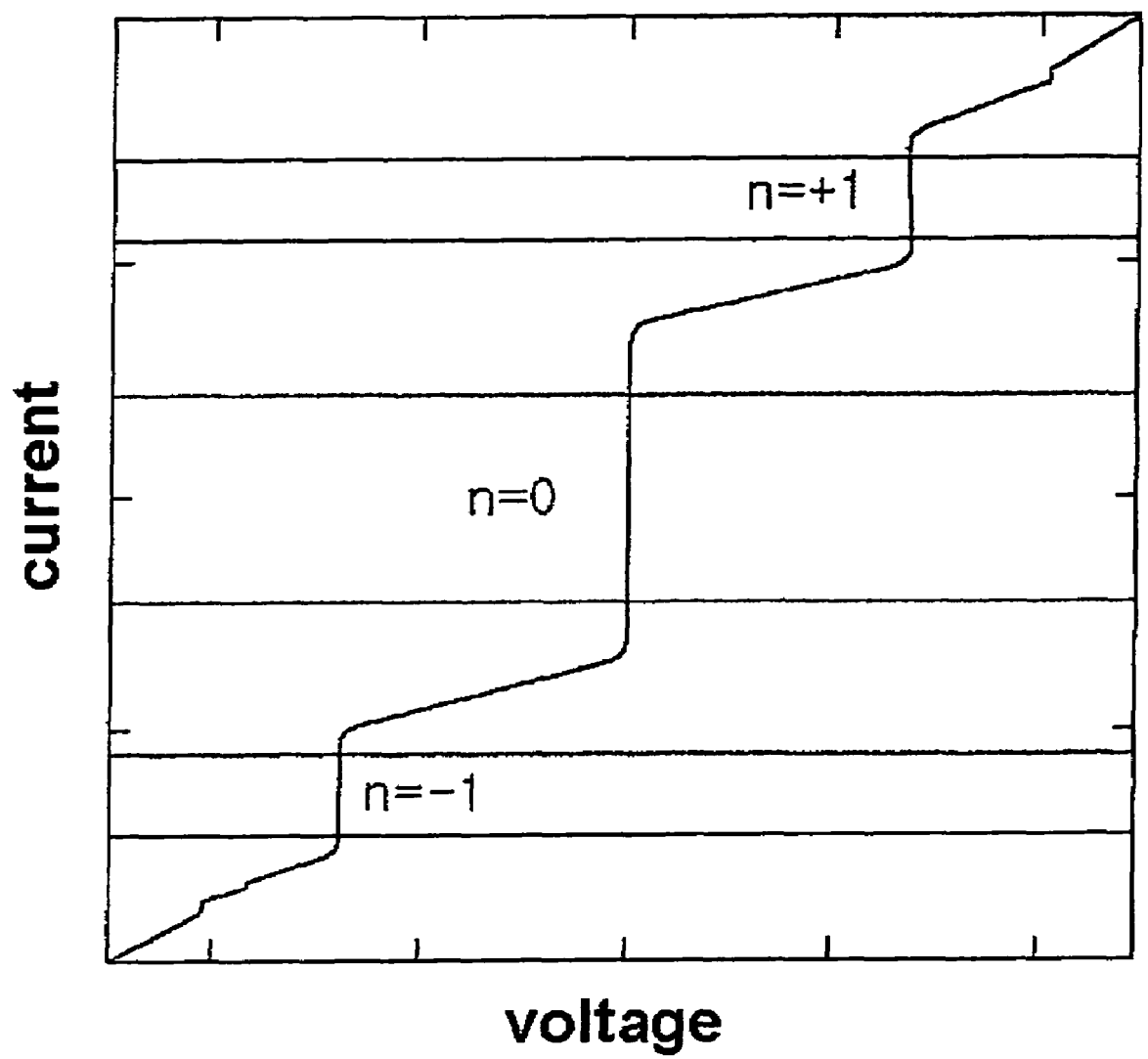
FIG. 1 is a representative graph showing the relationship of current and voltage output when microwaves are applied to a Josephson junction array.
Figure 2:
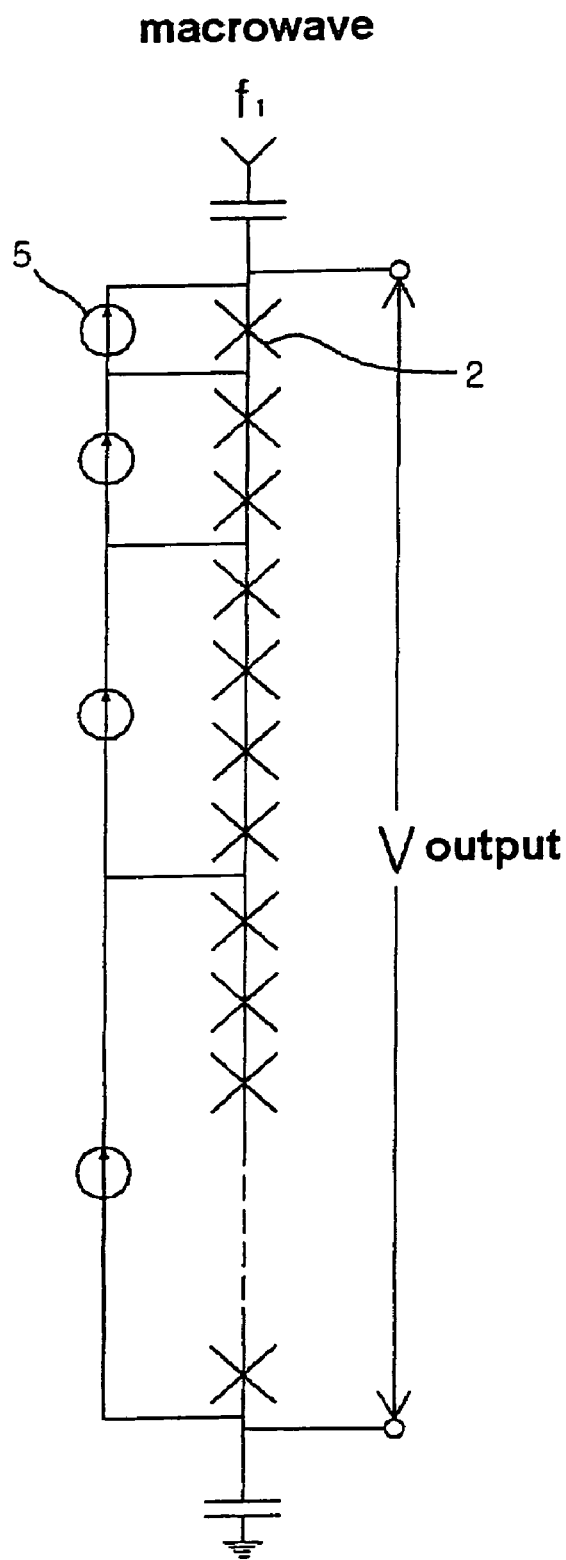
FIG. 2 is a circuit diagram of a Josephson junctions in a conventional programmable Josephson voltage standard device.
Figure 3:
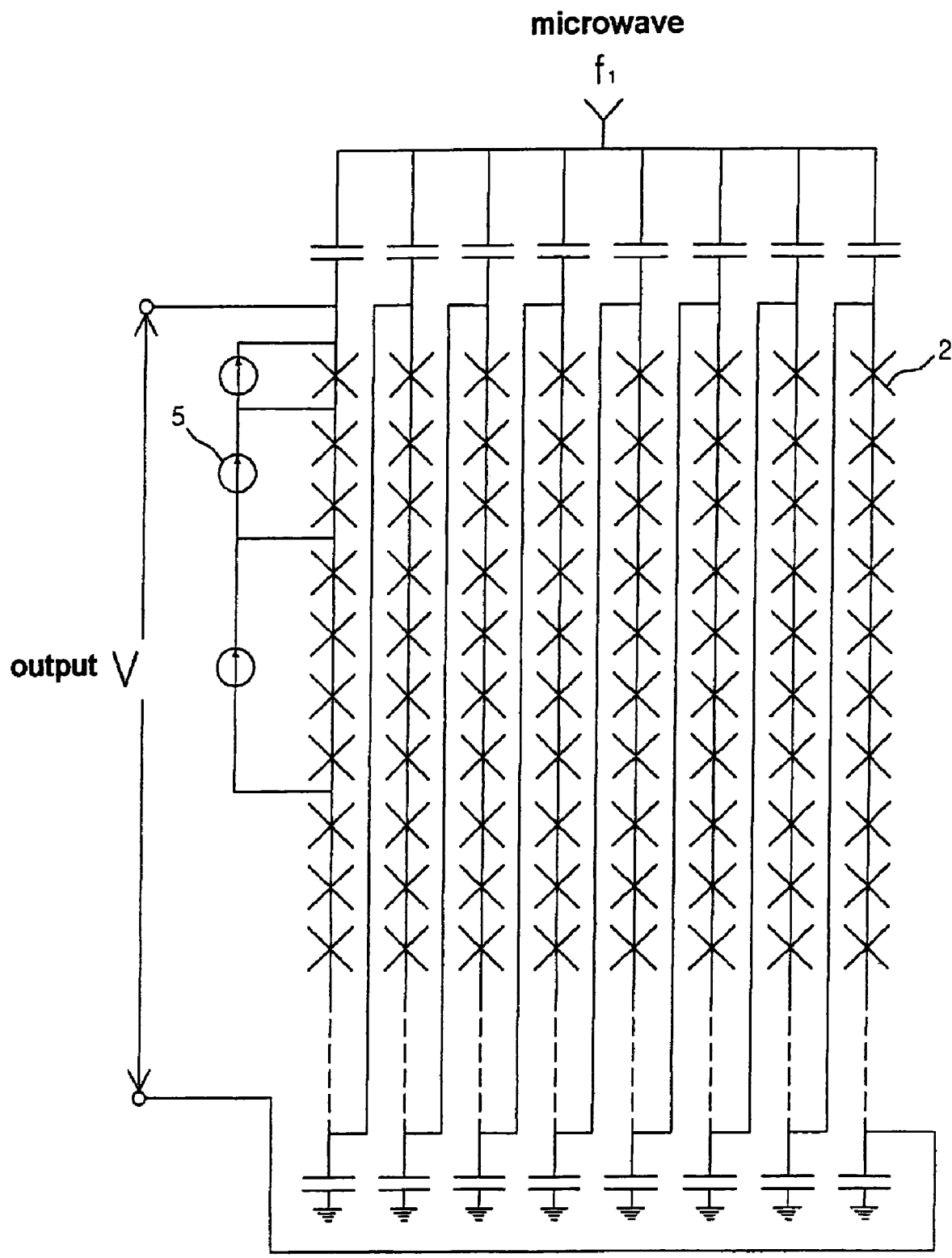
FIG. 3 is a circuit diagram showing an improved version of the Josephson voltage standard device illustrated in FIG. 2.
Figure 4:
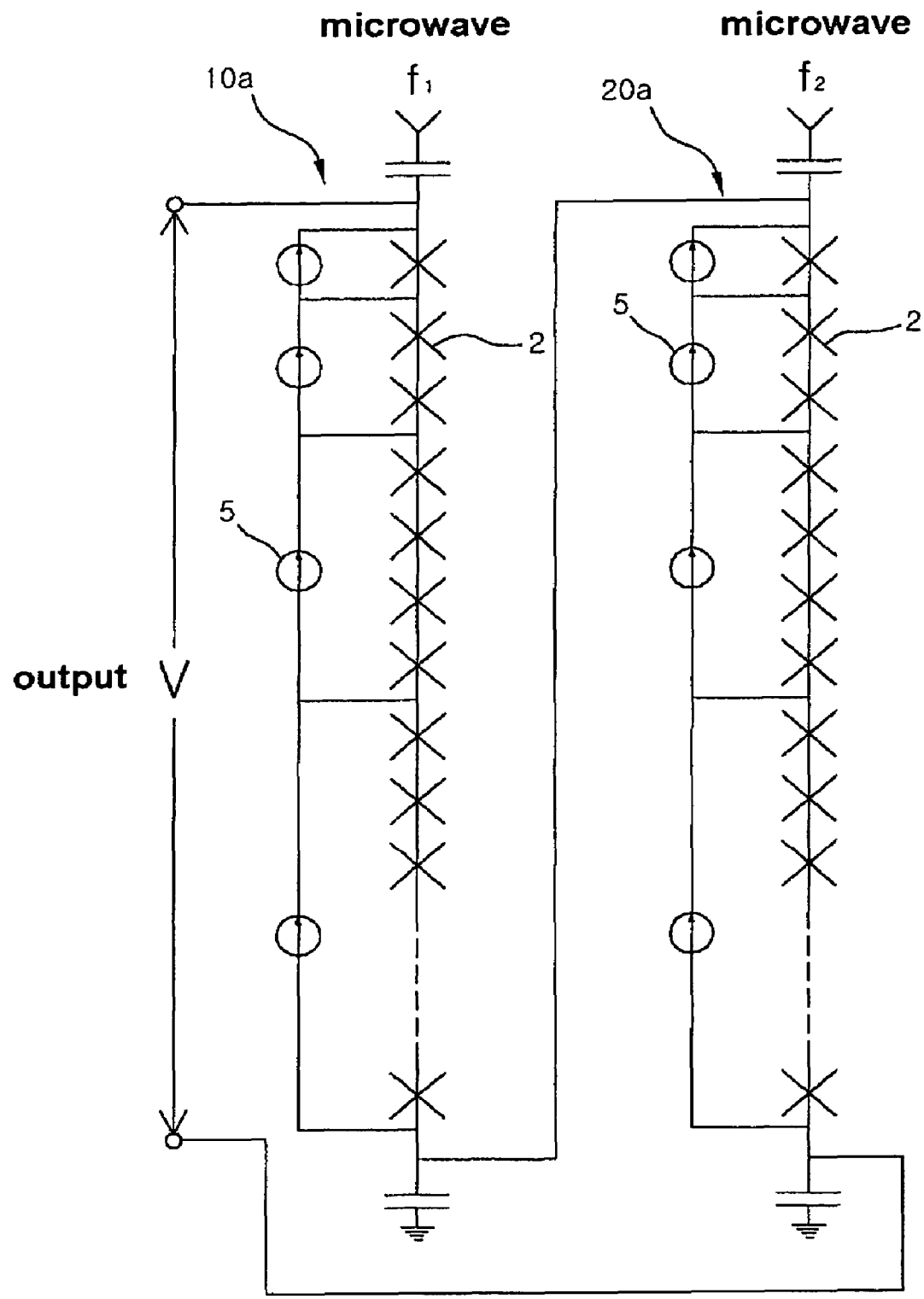
FIG. 4 is a circuit diagram of a programmable Josephson voltage standard device according to the first embodiment of the present invention.

FIG. 4 is a circuit diagram of a programmable Josephson voltage standard device according to the first embodiment of the present invention.

Referring to FIG. 4, about 500 to 150,000 Josephson junctions 2 are connected in series in a first element group 10a. Microwaves having a frequency $f_1$ is applied to the first element group 10a. The microwave is typically in the range of 15 to 20 GHz.

Each of current biases 5 is to apply positive (+) current or negative (−) current to each section of the Josephson junctions 2 array, or stop the supply of current, in response to an external program command. The current biases 5 are connected to apply the current in a binary method in which the array is divided in the sections with sequence of $2^n$ (n=0. 1, 2, . . . ) junctions from the first Josephson junction 20.

For example, the first current bias 5 may apply current to the first Josephson junction 2, the second current bias 5 may commonly apply current to the second and third Josephson junctions 2, and the third current bias 5 may commonly apply current from the fourth Josephson junction 2 to the eleventh Josephson junction 2 etc.

The circuit connection construction of a second element group 20a is the same as that of the first element group 10a except that microwaves applied to the second element group 20a have a second frequency $f_2$. The second frequency $f_2$ may be set in the range of 15 to 20 GHz which is slightly different from the first frequency $f_1$. In particular, because the difference between the first and second frequencies determines the smallest unit of voltage, the smaller the difference between the first and second frequencies, the more accurately the output voltage can be controlled.

Furthermore, the first and second element groups 10a and 20a are connected in series. In this case, if the first and second element groups 10a and 20a are ideally connected by a superconductor line, there is no voltage drop between the elements.

Furthermore, the output voltage $V_{output}$ is induced between ends of the first element group 10a and the second element group 20a. If the number of the junctions 2 increases, a circuit can be constructed in which the microwaves launch is split in order to prevent attenuation of the microwaves in the same manner as the prior art.

A typical 1V SNS type programmable Josephson device includes about 30,000 Josephson junction in order to obtain an output voltage of 1 V, and is operated in the frequency range of 15 to 20 GHz. In this case, each of the Josephson junctions generates voltage of 30 to 40 μV based on the Josephson relation expressed in Equation 1. This voltage becomes the smallest unit of voltage that can be changed by controlling the current bias.

If two Josephson devices are connected in series and the frequencies of microwaves applied to each device are slightly different, the smallest units of voltage change in each device will be also slightly different from each other. In case where two different frequencies $f_1$, $f_2$ are used, a voltage defined by Equation 1 with the frequency difference ($\Delta f = f_2 - f_1$) of the microwaves becomes the smallest unit of voltage that can be changed by controlling current.

Second Embodiment

Figure 5:
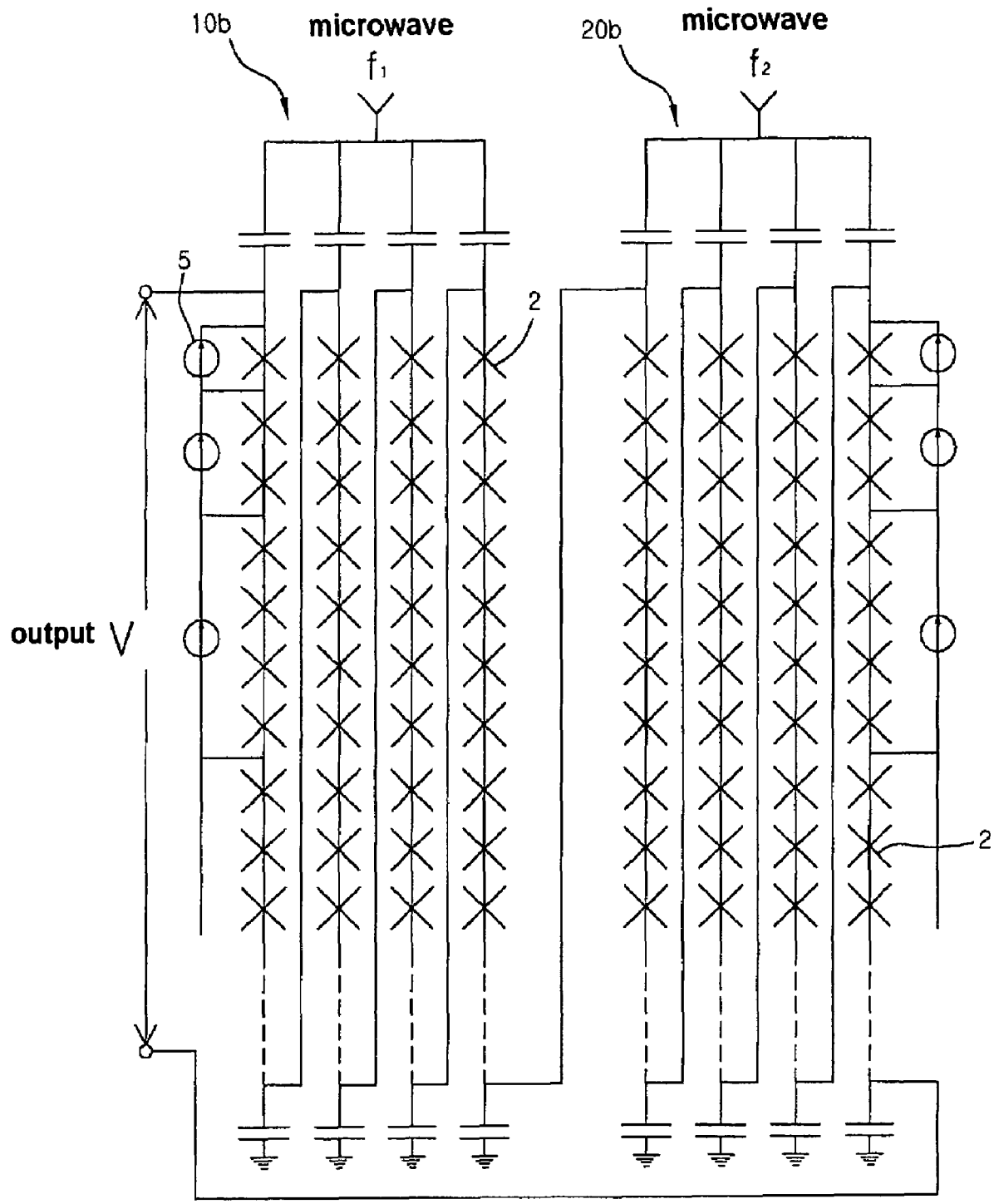
FIG. 5 is a circuit diagram of a programmable Josephson voltage standard device according to the second embodiment of the present invention.

FIG. 5 is a circuit diagram of a programmable Josephson voltage standard device according to the second embodiment of the present invention.

Referring to FIG. 5, a plurality of first element groups 10a to which microwaves of a first frequency $f_1$ are applied are connected in parallel to form a first element group collection 10b. A plurality of second element groups 20a to which microwaves of a second frequency $f_2$ are applied are connected in parallel to form a second element group collection 20b. The first and second element group collections 10b, 20b are connected in series.

The operation of the programmable Josephson voltage standard device constructed above will be described in detail in connection with several examples with reference to the first and second embodiments.

FIRST DESCRIPTION EXAMPLE

Referring to FIG. 4, it is first assumed that an element includes 30,000 junctions. For example, in the case where two elements are driven with microwaves of two frequency of 16.0000000 GHz ($f_1$) and 16.000533 GHz (=16×[1+1/30,000]) ($f_2$), respectively, each element has the smallest voltage change units of 33.08534 μV and 33.08644 μV, respectively. By properly controlling the polarity of each element in a state where desired number of junctions in each element are turned on (current biased), a final output voltage can be finely controlled in a fine unit of 1/30,000 of 0.33 μV (the voltage of the unit Josephson junction), that is, 1.10 nV (i.e., a difference in the smallest voltage change unit between the two elements).

For example, in the case where it is desired to generate an output voltage of 3.3 nV, if three junctions are turned on to the negative (−) polarity in the first element group 10a and three junctions are turned on to the positive (+) polarity in the second element group 20a, +3.3 nV, as the sum of the two voltages, can be obtained since the two element groups 10a, 20a are connected in series.

If a finer change of voltage is required, the unit voltage can be further divided by connecting a third element group (not shown) in series to the first and second element groups 10a, 20a and using three different microwave frequencies in the same manner. In a practical point of view, voltage control of 1 nV level is possible although only two element groups and two frequencies $f_1$, $f_2$ are used. It means that in most of applications, voltage can be changed almost continuously.

SECOND DESCRIPTION EXAMPLE

As a simple example, it is assumed that each element has $N_{tot}$=10,000 junctions, and voltage output from each junction in the first element group 10a is 1.000 μV. At this time, it is assumed that a frequency difference is as follows.

$$\Delta f = \frac{f_1}{N_{fine}} = \frac{f_1}{1000} \quad \text{[Equation 2]}$$

In this case, the unit voltage at the second element group 20a is proportional to the frequency, resulting in 1.001 μV. Consequently, the maximum voltage output from the respective element group will be ±10 mV and ±10.010 mV, if current bias is applied to all the junctions in the same polarity. The output voltage $V_{output}$ of the entire elements will become the sum of voltages of the element groups 10a, 20a. At this time, by combining the number of junctions in the voltage state in each element, a desired voltage can be obtained.

THIRD DESCRIPTION EXAMPLE

If it is desired to obtain output voltage of +5.763000 mV, 5,763 junctions are to be biased in positive (+) polarity in the first element group 10a. In contrast, if it is desired to obtain output voltage of 5.763255 mV, it cannot be obtained by using only one of the two element groups, but can be obtained by biasing 255 junctions of the second element group 20a in (+) polarity and (5763-255) junctions of the first element group 10a in (+) polarity.

FOURTH DESCRIPTION EXAMPLE

As an alternative example, if it is desired to obtain the output of +0.020783 mV, it can be obtained by biasing 783 junctions of the second element group 20a in (+) polarity and (20-783) junctions of the first element group 10a in (+) polarity, that is, (783-20) junctions in (−) polarity.

In this case, there is a disadvantage in that a fine voltage control cannot be achieved up to the maximum voltage value (=$2N_{tot}$X unit voltage) by using the two element groups, but is possible only in the range of 0 to ($2N_{tot}$-$N_{fine}$)×unit voltage. $N_{fine}$ indicates the number of junctions necessary to produce all voltages with an increment of the smallest unit voltage unit, wherein the smallest unit voltage is determined by the frequency difference of the driving frequencies. In this case, $N_{fine}$ is 1,000.

Another method of producing 0.020783 mV includes biasing (1,000-783) junctions of the second element group 20a in (−) polarity and (20+1+217) junctions of the first element group 10a in (+) polarity. In other words, −0.000217 mV is obtained from a combination of the first element group 10a and the second element group 20a, and +0.021 mV is obtained from the element 1, and then the two voltages are added.

If 500 junctions (i.e., $N_{fine}$/2) or 512 junctions (9 bits) as binary bits are additionally added to each element group in this method, small voltage change is possible in the range of (0 to $2N_{tot}$)×unit voltage. Accordingly, in actual applications, it is preferred that an element group be fabricated with $N_{fine}$ additional junctions for fine voltage control with the maximum voltage output of $2N_{tot}$×unit voltage.

As an actual example, in case where two 1 V programmable devices respectively having about 30,000 junctions are used, and if 512 junctions are added to each device and the microwave frequency difference is set to Δf=16/1,000 GHz, the output voltage can be controlled rapidly and accurately between 0 to $2N_{tot}$×unit voltage (33.08534 μV) by the unit of 33.08534 μV/1,000=33.085 nV, only with current bias control. By making the frequency difference smaller, a more precise control of voltage can be obtained.

As described above, according to the present invention, multiple microwaves of two or more different frequencies are applied to multiple Josephson voltage standard devices or a collection of several groups on the same device. Accordingly, it is possible to obtain rapid and precise voltage change only through the control of applied current without the need of changing microwave frequency.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A programmable Josephson voltage standard device employing microwave driving of multiple frequencies, comprising:
   a first element group having a plurality of Josephson junctions connected in series and applied with a first frequency;

a second element group having a plurality of Josephson junctions connected in series and applied with a second frequency different from the first frequency; and a current bias means for selectively applying positive (+) current or negative (−) current to the Josephson junctions of the element groups or stopping the supply of the current, in response to an input command;

wherein the first element group and second element group are connected in series, and wherein the current bias means is configured to apply current in a binary method in which the current is divided in the ratio of $2^n$ (n=0, 1, 2, . . . ) from the first Josephson junction of each of the element groups.

2. The programmable Josephson voltage standard device of claim 1, wherein each of the element groups includes 500 to 150,000 Josephson junction connected in series.

3. The programmable Josephson voltage standard device of claim 1, wherein the first and second frequencies are set in the range of 15 to 20 GHz.

* * * * *